(12) United States Patent
Feijoo et al.

(10) Patent No.: US 7,988,876 B2
(45) Date of Patent: Aug. 2, 2011

(54) METHOD FOR REDUCING AND HOMOGENIZING THE THICKNESS OF A SEMICONDUCTOR LAYER WHICH LIES ON THE SURFACE OF AN ELECTRICALLY INSULATING MATERIAL

(75) Inventors: Diego Feijoo, Burghausen (DE); Oliver Riemenschneider, Kiel (DE); Reinhold Wahlich, Tittmoning (DE)

(73) Assignee: Siltronic AG, Munich (DE)

( * ) Notice: Subject to any disclaimer, the term of this patent is extended or adjusted under 35 U.S.C. 154(b) by 790 days.

(21) Appl. No.: 12/023,223

(22) Filed: Jan. 31, 2008

(65) Prior Publication Data

US 2008/0188084 A1    Aug. 7, 2008

(30) Foreign Application Priority Data

Feb. 7, 2007   (DE) .................. 10 2007 006 151

(51) Int. Cl.
*B44C 1/22*         (2006.01)
*H01L 21/302*       (2006.01)
(52) U.S. Cl. ............... 216/99; 216/83; 216/84; 216/96; 438/745; 438/753; 438/755; 205/788.5; 205/789.5; 204/405
(58) Field of Classification Search .............. 216/83, 216/88, 96, 99, 84; 438/745, 753, 755; 205/788.5, 205/789.5; 204/405
See application file for complete search history.

(56) References Cited

U.S. PATENT DOCUMENTS

| | | | |
|---|---|---|---|
| 5,223,080 A | 6/1993 | Ohta et al. | |
| 5,277,835 A | 1/1994 | Ohmi et al. | |
| 5,427,052 A | 6/1995 | Ohta et al. | |
| 5,756,403 A * | 5/1998 | Tijburg et al. | 438/745 |
| 6,391,793 B2 | 5/2002 | Lee et al. | |
| 2004/0063329 A1 | 4/2004 | Yanagisawa et al. | |
| 2005/0001011 A1* | 1/2005 | Berasi et al. | 228/101 |
| 2005/0079714 A1 | 4/2005 | Huang et al. | |
| 2005/0186804 A1 | 8/2005 | Sasaki et al. | |
| 2006/0019201 A1* | 1/2006 | Muramatsu et al. | 430/311 |
| 2006/0097355 A1 | 5/2006 | Bauer et al. | |

(Continued)

FOREIGN PATENT DOCUMENTS

DE         69029228 T2    6/1997

(Continued)

OTHER PUBLICATIONS

English Abstract of Japan, Pub. No. JP 09008258 A, Pub. Date Jan. 10, 1997, Applicant: NEC Corporation, Inventor: Ogura Atsushi.

*Primary Examiner* — Shamim Ahmed
(74) *Attorney, Agent, or Firm* — Brooks Kushman P.C.

(57) ABSTRACT

To reduce and homogenize the thickness of a semiconductor layer which lies on the surface of an electrically insulating material, the surface of the semiconductor layer is exposed to the action of an etchant whose redox potential is adjusted as a function of the material and the desired final thickness of the semiconductor layer, so that the material erosion per unit time on the surface of the semiconductor layer due to the etchant becomes less as the thickness of the semiconductor layer decreases, and is only from 0 to 10% of the thickness per second when the desired thickness is reached. The method is carried out without the action of light or the application of an external electrical voltage.

13 Claims, 3 Drawing Sheets

U.S. PATENT DOCUMENTS

| | | |
|---|---|---|
| 2006/0118935 A1 | 6/2006 | Kamiyama et al. |
| 2007/0190746 A1 | 8/2007 | Ito et al. |
| 2010/0059180 A1* | 3/2010 | Matsumura et al. ..... 156/345.27 |

FOREIGN PATENT DOCUMENTS

| | | |
|---|---|---|
| DE | 102004054566 A1 | 5/2006 |
| EP | 488642 A2 | 6/1992 |
| EP | 511777 A1 | 11/1992 |
| EP | 0 553 855 A2 | 8/1993 |
| EP | 1 251 556 A1 | 10/2002 |
| EP | 1480265 A2 | 11/2004 |
| EP | 1635396 A1 | 3/2006 |
| JP | 09008258 A | 1/1997 |
| JP | 2005-228965 A | 8/2005 |

* cited by examiner

METHOD FOR REDUCING AND HOMOGENIZING THE THICKNESS OF A SEMICONDUCTOR LAYER WHICH LIES ON THE SURFACE OF AN ELECTRICALLY INSULATING MATERIAL

BACKGROUND OF THE INVENTION

1. Field of the Invention

The present invention relates to a method for thinning and planarizing a semiconductor layer by means of an etching treatment with locally varying material erosion.

2. Background Art

An example of a technologically relevant semiconductor layer is the functional layer of an SOI wafer (SOI=Semiconductor on Insulator or Silicon on Insulator). As their functional layer, SOI wafers comprise a semiconductor layer, for example a silicon layer, which lies on one surface of a base wafer (or handle wafer). The thickness of the semiconductor layer varies as a function of the components to be processed. Distinction is generally made between so-called thin films (less than 100 nm thick) and so-called thick films (from 100 nm to about 80 µm thick). Either the base wafer may consist entirely of an electrically insulating material (for example glass, quartz, sapphire) or it may for example consist of a semiconductor material, preferably silicon, and merely be separated from the semiconductor layer by an electrically insulating layer. The electrically insulating layer may, for example, consist of silicon oxide.

The semiconductor layer of an SOI wafer must have a very homogeneous thickness extending to the outermost edge region. Particularly in the case of semiconductor layers with a thickness of 100 nm or less, transistor properties, for example the threshold voltage, vary very greatly in the event of inhomogeneous layer thicknesses. The absolute thickness tolerance for SOI wafers with thin and thick semiconductor layers depends on the layer thickness.

In order to be able to integrate as large a number of circuits as possible, the requisite layer thickness homogeneity must furthermore be ensured as far as the vicinity of the edge of the front side. This in turn means a very small edge exclusion. The term "front side" of an SOI wafer refers to the side which carries the functional layer, on or in which electronic components are subsequently produced.

All known methods for producing SOI wafers attempt to adjust a sufficient homogeneity of the semiconductor layer directly, although for extreme requirements it may be necessary to carry out a post-treatment of the finished or semiprocessed SOI wafer in order to improve the thickness homogeneity further.

A plurality of methods for the post-treatment of an SOI wafer, with the aim of improving the layer thickness homogeneity, are known in the prior art. Many of these methods involve local etching methods while scanning over the SOI wafer, greater etching erosion being provided at positions with a higher layer thickness: according to US2004/0063329A1, in a dry etching method, the surface of the SOI wafer is scanned with a nozzle through which a gaseous etchant is delivered locally. EP488642A2 and EP511777A1 describe methods in which the semiconductor layer of the SOI wafer is exposed surface-wide to an etchant. This etchant must however be locally activated by a laser beam or a light beam from a light source, which is focused by an optical system, while scanning the surface (photochemical etching).

All methods in which the surface of the semiconductor layer needs to be scanned in order to achieve locally varying etching erosion, are very time-intensive and therefore cost-intensive. Furthermore, scanning requires an elaborate movement of the light source or the nozzle, on the one hand, or the SOI wafer on the other hand.

Furthermore, additional inhomogeneities of the layer thickness occur particularly in the edge region of the layer, i.e. in a region up to 5 mm away from the wafer edge, as well as in the regions where the overlap takes place during the scanning. For a layer thickness of 520 nm, a layer thickness homogeneity of 10 nm is achieved according to EP488642A2 without specifying an edge exclusion. According to EP511777A1, for a layer thickness of 108 nm, a layer thickness homogeneity of 8 nm is achieved without specifying an edge exclusion.

DE102004054566A1 describes a method for planarizing a semiconductor layer, in which—after position-dependent measurement of the thickness of the semiconductor layer—the SOI wafer is etched while exposing the entire surface of the wafer. The erosion rate of the etching treatment depends on the light intensity on the surface of the semiconductor wafer, and the light intensity is set position-dependently so that the differences in the previously measured position-dependent layer thickness are reduced by the position-dependent erosion rate. This method corrects local thickness differences of the semiconductor layer very effectively, although it requires additional outlay which increases the cost: a thickness measurement before the etching, the production of a mask for the exposure, and an exposure device.

JP09-008258A describes a method in which the silicon layer of an SOI wafer is etched with simultaneous exposure of the entire surface, and its thickness is homogenized. The process is self-regulating, because the etching rate depends on the number of holes (i.e. defect electrons, that is to say positive charge carriers) which are generated by the light, and therefore on the volume illuminated and consequently on the local silicon layer thickness over the insulating layer. Below a particular residual thickness of the silicon layer, the quantity of charge carriers generated by the light is no longer sufficient and the thinning stops. Since the absorption of light in the silicon layer also depends on the wavelength of the light, this approach furthermore makes it possible to adjust different residual thicknesses of the silicon layer. This method does not therefore require any external position-dependent regulating of the light intensity, or any thickness measurement before the etching, and no mask, although the etching device must still be constructed in an elaborate way such that that light can be directed appropriately.

SUMMARY OF THE INVENTION

It is therefore an object of the invention to homogenize the semiconductor layer of an SOI wafer, without requiring elaborate auxiliary equipment such as illumination devices. These and other objects are achieved by a method for reducing and homogenizing the thickness of a semiconductor layer which lies on the surface of an electrically insulating material, wherein the surface of the semiconductor layer is exposed to the action of an etchant whose redox potential is adjusted as a function of the material and the desired final thickness of the semiconductor layer, so that the material erosion per unit time on the surface of the semiconductor layer due to the etchant becomes less as the thickness of the semiconductor layer decreases and is only from 0 to 10% of the thickness per second when the desired thickness is reached, and wherein the method is carried out without the action of light or the application of an external electrical voltage.

DETAILED DESCRIPTION OF THE PREFERRED EMBODIMENT

Figure 1:
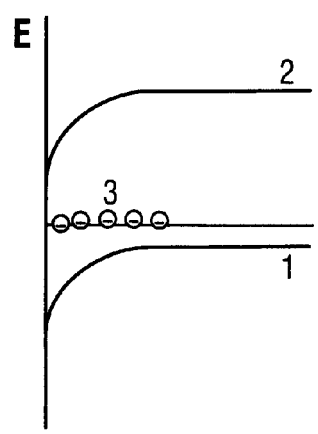
FIG. 1: band bending in p-doped silicon upon contact with hydrofluoric acid (hydrogen fluoride, HF, in aqueous solution).

The method of the invention may be employed for semiconductor wafers made of any materials which are applied on an electrically insulating layer or an electrically insulating base material. The method thus applies, for example, to all SOI wafers whose functional layer consists of semiconductor material. The semiconductor material preferably contains one or more substances which are selected from among silicon, germanium, silicon carbide, III/V compound semiconductors and II/VI compound semiconductors. The method of the invention may also be employed when the semiconductor layer consists of p-doped silicon. The method is preferably used for thinning and homogenizing SOI layers with a thickness of more than 1 μm which, for example have been produced by unilateral grinding or etching after the bonding of donor and base wafers, and which have functional layer thickness variations that are too large for particular applications. The electrically insulating material below the semiconductor layer is generally silicon oxide although other materials such as metal oxides, or nitrides, may also be used.

In the case of an SOI wafer produced by transferring a semiconductor layer from a donor wafer onto a base wafer, the method is carried out after bonding the wafers and separating the functional layer from the rest of the donor wafer. In the case of an SOI wafer, the method of the invention may be combined with one or more thermal processes for surface smoothing, for reinforcing the bonding strength, and/or in conjunction with one or more oxidation treatments for thinning the semiconductor layer. It is preferable for no polishing to be carried out after the method of the invention, so as not to again deteriorate the planarity.

The method may also be employed for SOI wafers which have been produced, not by transferring a semiconductor layer, but by other technologies, for example SIMOX. The method may also be employed when the semiconductor layer is not present over the entire wafer, but only locally. In this case, it may be necessary to protect other regions of the wafer against the etching action.

The method of the invention is carried out without the action of light. This obviates the need for an etching device adapted to the particular requirements of exposure. In order to carry out the inventive method, it is therefore possible to use a conventional etching device, in which a single SOI wafer or a plurality of SOI wafers can be treated simultaneously. Of course, "without action of light" does not mean that the method must be carried out in complete darkness. The action of daylight, or conventional artificial light used for room illumination, has no effect on the success or the economic viability of the method of the invention, and is of course permissible. The method does not, however, make use of light sources which, by their intensity and wavelength, generate charge carriers in the semiconductor layer that contribute significantly to the etching reaction. The method according to the invention is also carried out without applying an external electrical voltage.

The method is preferably carried out with a liquid etchant. In principle, the etchant may also be added for example as a gel or gas. According to the invention, the redox potential of the etchant is adjusted either so that the material erosion on the surface of the semiconductor layer due to the etchant automatically comes to a stop as soon as the desired final thickness of the semiconductor layer is reached, or so that the material erosion becomes so slow when the desired final thickness is reached that the etching process can be externally terminated after a certain time (for example by removing the wafer from the etchant), without thereby exceeding or falling below the desired final thickness in a way which is significant for practical purposes. The maximum "error" when externally terminating the etching reaction should not amount to more than 10% of the desired final thickness. Since the time taken for manually stopping the etching reaction is at most one second (for example in order to remove the wafer from the etchant), in the context of the invention it is sufficient for the etching erosion when reaching or approaching the desired final thickness of the semiconductor layer to be so small that it only amounts to between 0 and 10% of the thickness of the semiconductor layer per second. Expressed in absolute numbers, the etching rate when reaching the desired final thickness of the semiconductor layer should preferably be between 0 and 1 nm per second.

As will be described below, a suitable redox potential may be achieved by a suitable choice of the composition of the etchant. In particular, the constituents of the etchant or their concentrations, or both, may be selected suitably. In most cases, the redox potential of the etchant will be determined essentially by its pH. In these cases, the concentrations of the constituents of the etchant will be selected so that the etchant is adjusted to a suitable pH.

It is possible to select the pH of the etchant at the start of the etching treatment according to the invention so that a comparatively high etching rate is obtained. In the course of the etching treatment, the pH of the etchant and therefore its redox potential may subsequently be modified, preferably by adding (i.e. increasing the concentration of) one of its constituents, so that the etching rate lies in the range according to the invention when the desired final layer thickness is reached. Preferably, however, the pH is not modified during the etching treatment, i.e. preferably no substances are added while the etching treatment is being carried out.

The redox potential furthermore depends on the temperature. According to the Nernst equation, the redox potential is proportional to the temperature. The desired final thickness may additionally be influenced in this way.

If the semiconductor layer contains silicon or even consists essentially of silicon (which may of course be doped), then the etchant preferably contains one or more fluorine compounds. In particular, an etchant which contains hydrogen fluoride (HF) and a fluoride salt is preferred in this case. For practical reasons it is preferable to use water as a solvent, although water is not a mandatory constituent. The fluoride salt is preferably ammonium fluoride ($NH_4F$). Other salts are also possible in principle, although $NH_4F$ has the advantage that it is used in the semiconductor industry and is therefore available with the necessary specifications, that it makes it possible to adjust the pH when mixed with HF, and that it acts as a pH buffer when mixed with HF.

For different semiconductor layers, other etching solutions are necessary. For instance, germanium can be etched for example with hydrochloric acid ($HCl/H_2O$) or with an aqueous solution of hydrogen chloride and hydrogen peroxide ($HCl/H_2O_2/H_2O$), gallium arsenide (GaAs) can be etched for example with an aqueous solution of phosphoric acid and hydrogen peroxide ($H_3PO_4/H_2O_2/H_2O$) or with an aqueous solution of nitric acid and sulfuric acid ($HNO_3/H_2SO_4/H_2O$) indium phosphide (InP) can be etched for example with a mixture of hydrogen chloride and phosphoric acid ($HCl/H_3PO_4$) or with an aqueous solution of hydrogen chloride and nitric acid ($HCl/HNO_3/H_2O$).

The method according to the invention will be described in detail below with reference to use on SOI wafers with silicon functional layers and etchants based on HF or $NH_4F$ or mixtures thereof, although it may also be applied to other layer structures, other semiconductor materials and other etchants.

Silicon (Si) is an indirect semiconductor with a bandgap of 1.12 eV. The behavior in contact with an electrolyte can therefore be explained very clearly by the band model. If silicon is brought in contact with aqueous hydrofluoric acid (HF), for example, then equalization of the electrochemical potentials takes place at the interface between the silicon and the electrolyte. In order to prevent the emergence of freely mobile charge carriers from the silicon, a space charge zone is formed at the interface. An excess charge Q in the form of static charges is then formed in the space charge zone, i.e. there are no longer any freely mobile charge carriers there. This is countered on the electrolyte side of the interface by an opposite charge –Q in the form of an electrolytic double layer. Unless a solution is extremely dilute, it will contain a charge carrier concentration which exceeds that in silicon (depending on the doping level) by an order of magnitude. The charge on the electrolyte side can therefore be compensated for by a very thin layer in the range of a few nanometers.

Figure 2:
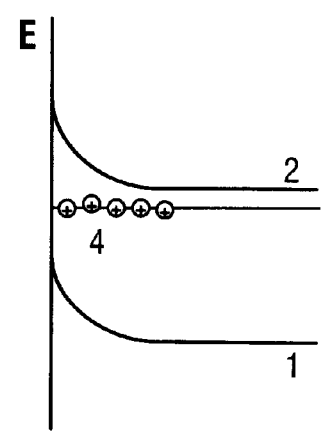
FIG. 2: band bending in n-doped silicon upon contact with hydrofluoric acid (hydrogen fluoride, HF, in aqueous solution).

On the other hand, for moderate to low dopings, the space charge zone in silicon extends over a depth of the order of one micrometer. The entire electrical potential, which is due to the charge Q in the silicon space charge zone and the electrolytic double layer, therefore falls off within the silicon. This potential drop in the space charge zone of the silicon entails band bending inside the silicon, at the interface between the silicon and the electrolyte (FIGS. 1, 2).

For p-doped silicon (FIG. 1), the valence and conduction bands (1 and 2 respectively) at the Si/HF interface are curved toward lower electron energies (downward). The silicon surface is therefore depleted of holes. For n-doped silicon (FIG. 2), on the other hand, the bands are curved toward higher electron energies (upward). The silicon surface is depleted of conduction band electrons. The symbols 3 and 4 respectively stand for the ionized dopant atoms.

The contact of HF with p-doped silicon having a resistivity of from 0.5 to 1 Ωcm leads to a space charge zone width of about 1 micrometer. Although the surface is depleted of holes, it could nevertheless still be etched by the HF solution. The required holes come from the bulk of the silicon, where they are thermally regenerated.

In general, two ways of dissolving silicon are available. On the one hand silicon may be attacked and dissolved directly, and on the other hand, the route of forming and dissolving silicon dioxide ($SiO_2$) may be adopted. In acidic solutions containing hydrofluoric acid, the direct route leads only to very low etching rates of a few tenths of a nm/min.

$$Si + 2HF_2^- + 2HF \leftrightarrows [SiF_6]^{2-} + 2H_2 \quad (1)$$

A two-stage process is therefore recommendable for etching with hydrofluoric acid. In a first step silicon is oxidized to form silicon dioxide, and the latter is subsequently dissolved by the hydrofluoric acid.

$$Si + 6H_2O + 4h^+ \leftrightarrows SiO_2 + 4H_3O^+ \quad (2)$$

$$SiO_2 + 4HF \leftrightarrows SiF_4 + 2H_2O \quad (3)$$

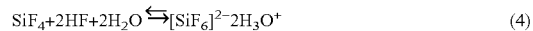

$$SiF_4 + 2HF + 2H_2O \leftrightarrows [SiF_6]^{2-} 2H_3O^+ \quad (4)$$

The rates of this reaction path are a factor of 1000 to 10000 higher than for direct dissolving of silicon according to Reaction Equation (1). Despite the simultaneous existence of both reaction paths, therefore, the direct dissolving may be neglected.

In principle all these considerations may be applied directly to the silicon layer of an SOI wafer, since an HF/Si interface is still involved. However, the behavior is not comparable to that of the bulk material. The crucial difference between bulk material and SOI material resides in the thickness of the functional layer.

Figure 3:
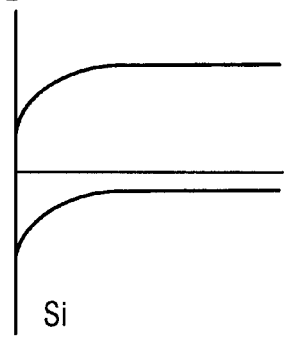
FIG. 3: profile of the space charge zone in bulk silicon material.
Figure 4:
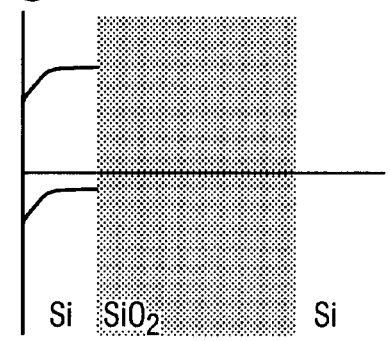
FIG. 4: profile of the space charge zone in the functional layer, consisting of silicon, of an SOI wafer.
Figure 5:
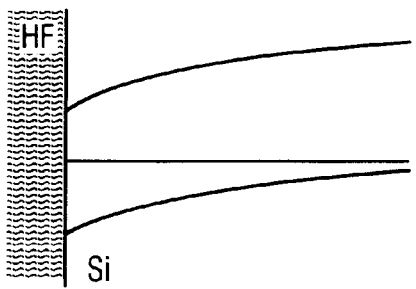
FIG. 5: sketched profile of the band bending inside a silicon wafer upon contact with an aqueous HF solution.

The band model per se is naturally retained even for a thin layer. However, the ratio of the space charge zone width to the thickness of the silicon layer changes. While the space charge zone in bulk material can extend over the entire thickness of the silicon wafer (FIG. 3), in the case of an SOI wafer it is limited to the thickness of the functional layer (FIG. 4). For the described resistivity range, the space charge zone in bulk material is at least an order of magnitude larger than the thickness of the functional layer of an SOI wafer.

Since only the charge carriers inside the functional layer need to be considered in the case of SOI, the band bending and the space charge zone width are also correspondingly less. The redox potential at the interface between the etchant and the silicon is therefore shifted, which has a corresponding effect on the reactions that are possible.

The model assumptions concerning the process of dissolving silicon by means of hydrofluoric acid are fully retained even for thin silicon layers. The dissolving of silicon on the surface of the functional layer also takes place via one of the two mechanisms, i.e. direct or indirect dissolving. The holes required for this ($h^+$, "defect electrons") are provided from the functional layer. This can now take place only from a very limited reservoir, however, since their number varies proportionally to the volume of silicon present. If the reaction at the interface takes away more holes from the silicon than can be thermally regenerated, then the absolute number of holes in the functional layer decreases until any hole that is generated is immediately accelerated to the interface. For a rapid reaction, this means that the space charge zone would extend over the entire thickness of the functional layer. If the reaction takes place more slowly, then the space charge zone width can also be smaller so that some of the functional layer continues to have free mobile charge carriers.

The width of the space charge zone inside the functional layer is crucial for the properties of the functional layer. In the normal case, the band bending leads to depletion of holes or electrons at the interface. Owing to the subsequent flat band potential, not all the charge carriers can follow the potential profile. But if the band bending spreads through the entire volume, then the potential will fall off across it. Full drainage of charge carriers is therefore possible. This situation occurs for example when etching an SOI wafer with a 100 nm thick semiconductor layer by an etching solution made up of 48% strength HF with $H_2O_2$ with pH 1 at room temperature: the semiconductor layer is preserved during an etching time of one hour, i.e. the final thickness of the semiconductor layer is more than 100 nm when using said etching solution. Under these conditions, several µm would be etched on bulk material.

The classical combination of hydrofluoric acid (HF) and nitric acid ($HNO_3$) likewise does not dissolve the silicon layer at room temperature. Only increasing the temperature to about 50° C. leads to the desired result within seconds. Compositions containing weaker oxidants such as phosphoric acid ($H_3PO_4$) or hydrogen peroxide ($H_2O_2$) do not etch the silicon layer at room temperature, and do so only very slowly at higher temperatures. Conversely, with strong oxidants such as chromic acid, full erosion of the silicon layer is possible within an extremely short time.

For partial etching of the functional layer, therefore, suitable etchants are needed. Suitable etchants must generate a band shift in the functional layer, such that the flat band potential in the functional layer is preserved.

For the SOI wafers in question, ammonium fluoride ($NH_4F$) is a suitable etchant. With respect to bulk material, it is known that an $NH_4F$ solution etches much more slowly than an HF solution. For the thin silicon layer of an SOI wafer, this relationship is reversed: for a 100 nm thick SOI layer, initial etching rates of a few nm/min can be achieved at room temperature.

Figure 6:
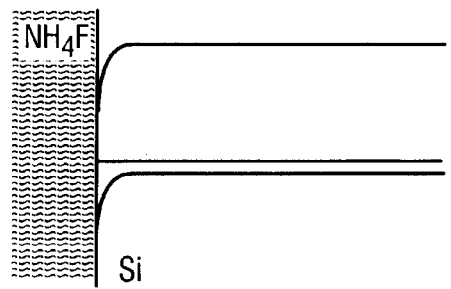
FIG. 6: sketched profile of the band bending inside a silicon wafer upon contact with an aqueous ammonium fluoride solution ($NH_4F$).

The difference between an ammonium fluoride solution and a hydrogen fluoride solution—besides the different cations—resides in the pH of the solution. An HF solution has a pH of about 1 and an $NH_4F$ solution has a pH of about 7. The different pH value leads to a shift in the chemical potential of the $NH_4F$ solution in relation to the HF solution. From the literature, it is known that the band bending in silicon also varies linearly with the pH. The chemical potential of the $NH_4F$ solution matches the potential of the band bending of the silicon of the functional layer better than the potential of an HF solution does. At the same time, the reaction takes place more slowly and only a few holes are needed per unit time, which leads to a smaller space charge zone width in the functional layer. The flat band potential is maintained in the functional layer (FIG. 6). The etching of the functional layer therefore takes place similarly as that of the bulk material. In comparison with the etching of bulk material by an HF solution, however, it occurs much more rapidly.

Figure 7:
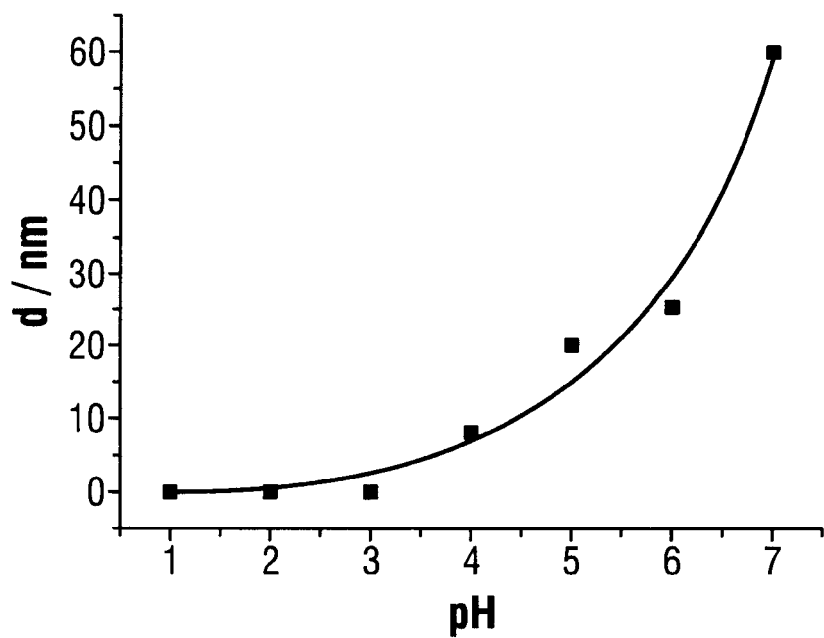
FIG. 7: dependency of the etching depth d (in nm) in the 100 nm thick silicon layer of an SOI wafer on the pH of the aqueous etching solution used, comprising a mixture of 5% strength HF and 5% strength $NH_4F$, at a temperature of 25° C. after an etching time of t=5 min. The curve represents an exponential fit of the dependency.

Adjusting the pH provides the opportunity to optimize the effect of the etchant further. For example, the pH and therefore the etching rate may be varied by mixing HF and $NH_4F$ solutions. The effect of the pH on the etching rate was studied with the aid of a series of mixtures made from a 5% strength HF solution and a 5% strength $NH_4F$ solution. From these solutions, all pH values between 1 and 7 can be adjusted by means of different mixing ratios without thereby affecting the concentration of fluoride ions. SOI wafers having a silicon layer with an initial thickness of 100 nm were etched in the etching solutions thus produced, respectively with a different pH, for a defined time (5 minutes). The temperature was kept at 25° C. FIG. 7 reveals an exponential rise in the etching depth d (in nm) with an increasing pH, which corresponds to an exponential rise in the etching rate with the pH. For pH=7 a maximum of 12 nm/min is reached, although this may also be increased further by changes in concentration and temperature. The response to a pH shift is therefore the reverse of the response in the case of bulk material. The redox potential at the interface is shifted in favor of a reaction with ammonium fluoride. An HF—$NH_4F$ solution is therefore capable of eroding the functional layer at room temperature with an adjustable etching rate of from 1 to 12 nm/min.

When the functional layer becomes thinner and thinner with continued etching, the same effect as was found for hydrofluoric acid finally comes into play: the number of charge carriers remaining in the thin functional layer become smaller and smaller, so that the band bending also becomes progressively weaker. Associated with this, there is a shift in the redox potential at the interface. Owing to this shift, the etching rate decreases until reaction with the ammonium fluoride solution is no longer possible.

Figure 8:
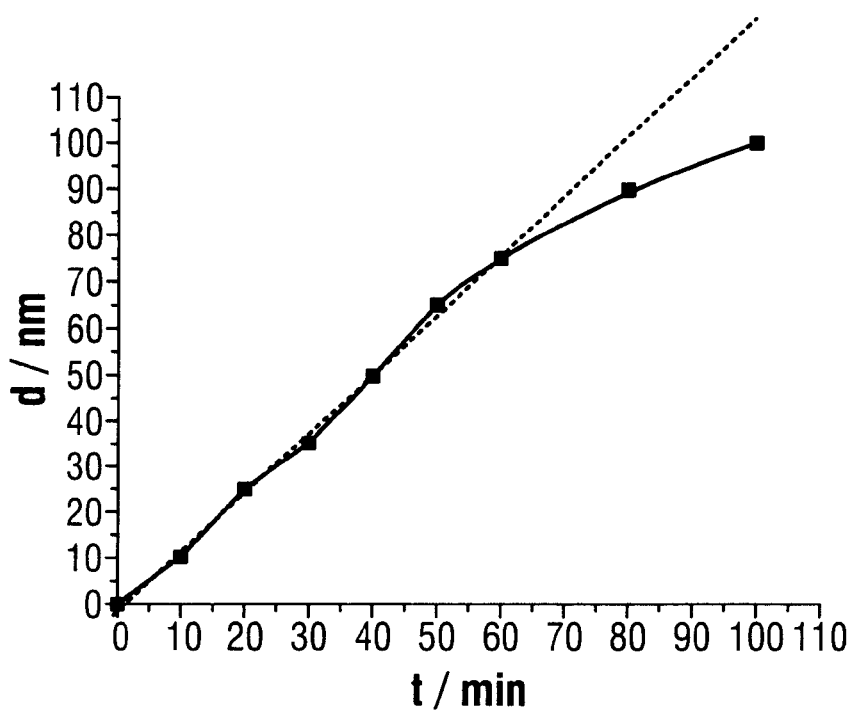
FIG. 8: profile of the etching depth d (in nm) with the reaction time t (in min) for an aqueous solution comprising a mixture of 10% strength HF and 10% strength $NH_4F$ solutions on the 100 nm thick silicon layer of an SOI wafer. The pH was adjusted to a value of 5.5. The temperature was kept at 25° C. The straight line represents a linear extrapolation of the measurement values up to t=60 min.

Studying the etching depth on SOI wafers as a function of the reaction time confirms this hypothesis. FIG. 8 represents the etching depth d (in nm) after various etching times for the 100 nm thick silicon layer of an SOI wafer. The etching solution consists of a mixture of 10% strength aqueous HF and 10% strength aqueous $NH_4F$ with a pH of 5.5. The etching temperature was kept at 25° C. A clear linear dependency of the etching depth on the reaction time can be seen, until a depth of approximately 75 nm is exceeded after an etching time of about 60 min. If the initial etching rate were to be extrapolated, then the entire 100 nm thick semiconductor layer should be etched away after an etching time of 80 min. However, a thin silicon layer remains even with an etching time of 100 min, which can be seen from the fact that the oxide is not attacked.

Figure 9:
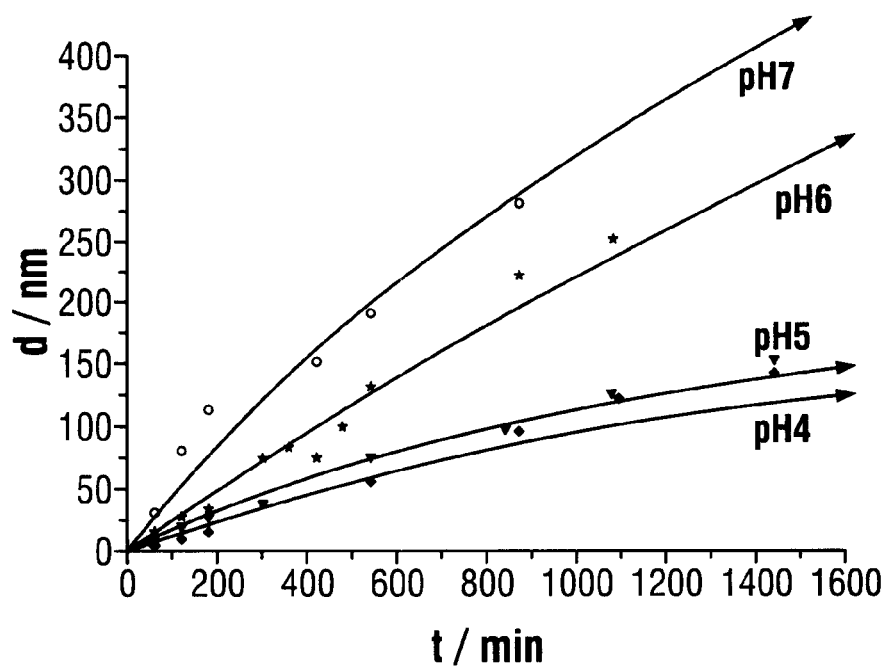
FIG. 9: profile of the etching depth d (in nm) with the reaction time t (in min) for a 2200 nm thick silicon layer of an SOI wafer for aqueous etching solutions comprising mixtures of 5% strength HF and 5% strength $NH_4F$ solutions and with different pH values at a temperature of 10° C.

FIG. 9 describes the development of the etching depths d (in nm) as a function of the etching time t (in min) for SOI wafers with a 2200 nm thick semiconductor layer, which were etched with the aid of etching solutions having different pH values. The pH values of the etching solutions were respectively established by mixing 5% strength aqueous HF and 5% strength aqueous $NH_4F$ solutions in suitable ratios. The temperature was kept at 10° C. It can be seen that the etching action decreases as the etching time increases, i.e. the etching rate decreases as the thickness of the semiconductor layer decreases. The etching depths tend toward different limit values as the etching time increases, i.e. different final thicknesses of the silicon layer can be achieved with a different pH of the etching solution.

This property of ammonium fluoride solutions may be employed as an etch stop for SOI wafers, in so far as the functional layer becoming thinner prevents itself from being penetrated. The depth of the etch stop action may be regulated by adjusting the pH.

Figure 10:
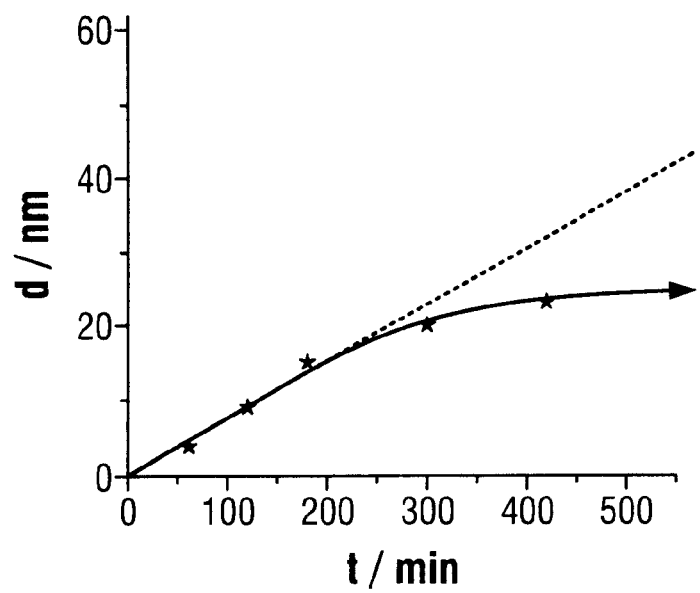
FIG. 10: profile of the etching depth d (in nm) with the reaction time t (in min) in a 100 nm thick silicon layer of an SOI wafer for an aqueous etching solution comprising a mixture of 5% strength HF and 5% strength $NH_4F$ solutions with a pH of 4 and a temperature of 10° C.

FIG. 10 shows the way in which an SOI wafer with an initially 100 nm thick semiconductor layer can be thinned in a controlled way. An aqueous etching solution, in which a pH of 4 was adjusted by mixing 5% strength aqueous HF and 5% strength aqueous NH$_4$F in a suitable ratio, etches at most about 25 nm at a temperature of 10° C. (etching depth d≈25 nm with prolonged etching time t), i.e. the thickness of the semiconductor layer can be reduced in a controlled way to 75 nm. This thickness may be controlled by changing the pH. With a pH of 5, for example, the semiconductor layer is reduced to a final thickness of about 50 nm.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for homogenizing the thickness of a semiconductor layer which lies on the surface of an electrically insulating material comprising selecting a target thickness, and reducing the thickness of the semiconductor layer to a reduced target thickness by contacting the surface of the semiconductor layer with an etchant whose redox potential is adjusted as a function of both the material of the semiconductor layer and the target thickness of the semiconductor layer and etching the semiconductor layer, so that the erosion of the surface of the semiconductor layer per unit time by the etchant becomes less as the thickness of the semiconductor layer decreases and is only from 0 to 10% of the final thickness per second when the target thickness is reached, and wherein the method is carried out without the action of light or the application of an external electrical voltage.

2. The method of claim 1, wherein the semiconductor layer comprises one or more of silicon, germanium, silicon carbide, III/V compound semiconductors, and II/VI compound semiconductors.

3. The method of claim 1, wherein the redox potential of the etchant is adjusted via the composition of the etchant.

4. The method of claim 3, wherein the redox potential of the etchant is adjusted via the choice of the constituents of the etchant.

5. The method of claim 3, wherein the redox potential of the etchant is adjusted via the concentrations of the constituents of the etchant.

6. The method of claim 5, wherein the redox potential of the etchant is determined essentially by its pH, and wherein the concentrations of the constituents of the etchant are selected so that a suitable pH is obtained.

7. The method of claim 3, wherein the redox potential is additionally adjusted via a selection of an etching temperature.

8. The method of claim 3, wherein the semiconductor layer comprises silicon and the etchant comprises one or more fluorine compounds.

9. The method of claim 8, wherein the etchant comprises hydrogen fluoride and a fluoride salt.

10. The method as claimed in claim 9, wherein at least one fluoride salt is ammonium fluoride.

11. The method of claim 1, wherein the semiconductor layer comprises p-doped silicon.

12. The method of claim 1, wherein the semiconductor layer is the functional layer of an SOI wafer.

13. The method of claim 1, wherein material erosion per unit time on the surface of the semiconductor layer due to the etchant is from 0 to 1 nm when the desired final thickness is reached.

* * * * *